(12) United States Patent
Lindemann

(10) Patent No.: US 10,771,021 B2
(45) Date of Patent: Sep. 8, 2020

(54) THERMAL PROTECTION OF AN AMPLIFIER DRIVING A CAPACITIVE LOAD

(71) Applicant: Cirrus Logic International Semiconductor Ltd., Edinburgh (GB)

(72) Inventor: Eric Lindemann, Boulder, CO (US)

(73) Assignee: Cirrus Logic, Inc., Austin, TX (US)

( * ) Notice: Subject to any disclaimer, the term of this patent is extended or adjusted under 35 U.S.C. 154(b) by 44 days.

(21) Appl. No.: 16/269,063

(22) Filed: Feb. 6, 2019

(65) Prior Publication Data

US 2019/0260336 A1 Aug. 22, 2019

Related U.S. Application Data

(60) Provisional application No. 62/632,821, filed on Feb. 20, 2018.

(51) Int. Cl.

| | |
|---|---|
| H03F 1/30 | (2006.01) |
| H03F 1/52 | (2006.01) |
| H03F 3/187 | (2006.01) |
| H03F 3/21 | (2006.01) |
| H03H 7/01 | (2006.01) |
| H04R 3/06 | (2006.01) |
| H04R 19/04 | (2006.01) |

(52) U.S. Cl.
CPC .............. *H03F 1/52* (2013.01); *H03F 1/30* (2013.01); *H03F 3/187* (2013.01); *H03F 3/21* (2013.01); *H03H 7/0153* (2013.01); *H04R 3/06* (2013.01); *H04R 19/04* (2013.01)

(58) Field of Classification Search
CPC .......................................................... H03F 1/30
USPC .................................................. 330/289, 298
See application file for complete search history.

(56) References Cited

U.S. PATENT DOCUMENTS

| | | | | |
|---|---|---|---|---|
| 3,891,938 A | * | 6/1975 | Mikhael ............... | H03H 11/126 330/107 |
| 5,132,632 A | * | 7/1992 | Russell ................. | H03B 19/18 327/119 |
| 5,177,453 A | * | 1/1993 | Russell ................. | H03B 19/18 330/136 |

\* cited by examiner

*Primary Examiner* — Henry Choe
(74) *Attorney, Agent, or Firm* — Jackson Walker L.L.P.

(57) ABSTRACT

A system for thermally protecting an amplifier driving a capacitive load may include a low-pass filter configured to filter, with a variable cutoff frequency, an input signal to generate a filtered input signal, wherein the amplifier is configured to receive the filtered input signal and amplify the filtered input signal to generate a driving signal to the capacitive load and a controller configured to receive a real-time estimate of a temperature associated with the amplifier and vary the variable cutoff frequency as a function of the temperature.

18 Claims, 2 Drawing Sheets

THERMAL PROTECTION OF AN AMPLIFIER DRIVING A CAPACITIVE LOAD

RELATED APPLICATION

The present disclosure claims priority to U.S. Provisional Patent Application Ser. No. 62/632,821, filed Feb. 20, 2018, which is incorporated by reference herein in its entirety.

FIELD OF DISCLOSURE

The present disclosure relates in general to thermally protecting an amplifier driving a capacitive load.

BACKGROUND

In many applications, an amplifier may be used to drive a capacitive load. An example of a capacitive load is a piezoelectric transducer. A piezoelectric transducer may have many uses, including in surface audio applications, wherein a piezoelectric actuator is mechanically coupled to a surface such as the screen of a smartphone, tablet, personal computer, or other device. The vibrational transducer may, in response to an input signal received by the vibrational transducer, generate vibrational energy to vibrate the surface to generate sound.

It is known that impedance of a capacitive load monotonically decreases with a frequency of a signal driven to a capacitive load, meaning that maintaining voltage signal across a capacitive load requires increasing current as the frequency of the voltage signal increases. In many applications, it is common to test devices using sinusoidal tones of constant peak voltage at various frequencies. This may pose a challenge to amplifiers driving capacitive loads when high-frequency sinusoidal tones are tested, as the current demands from the amplifier at such frequencies may cause excessive heating in the amplifier, leading to damage. Even in normal usage, for example when playing audio content to a piezoelectric transducer, high-frequency content may be present (e.g., cymbal crashes and/or synthesized sounds in music content) that may cause excessive amplifier heating.

SUMMARY

In accordance with the teachings of the present disclosure, the disadvantages and problems associated with thermal protection of an amplifier driving a capacitive load may be reduced or eliminated.

In accordance with embodiments of the present disclosure, a device may include a capacitive load, a low-pass filter configured to low-pass filter, with a variable cutoff frequency, an input signal to generate a filtered input signal, an amplifier configured to receive the filtered input signal and amplify the filtered input signal to generate a driving signal to the capacitive load, and a controller configured to receive a real-time estimate of a temperature associated with the amplifier and vary the variable cutoff frequency as a function of the temperature.

In accordance with these and other embodiments of the present disclosure, a method for thermally protecting an amplifier driving a capacitive load may include low-pass filtering, with a variable cutoff frequency, an input signal to generate a filtered input signal, wherein the amplifier is configured to receive the filtered input signal and amplify the filtered input signal to generate a driving signal to the capacitive load, receiving a real-time estimate of a temperature associated with the amplifier, and varying the variable cutoff frequency as a function of the temperature.

In accordance with these and other embodiments of the present disclosure, a system for thermally protecting an amplifier driving a capacitive load may include a low-pass filter configured to filter, with a variable cutoff frequency, an input signal to generate a filtered input signal, wherein the amplifier is configured to receive the filtered input signal and amplify the filtered input signal to generate a driving signal to the capacitive load and a controller configured to receive a real-time estimate of a temperature associated with the amplifier and vary the variable cutoff frequency as a function of the temperature.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1A:
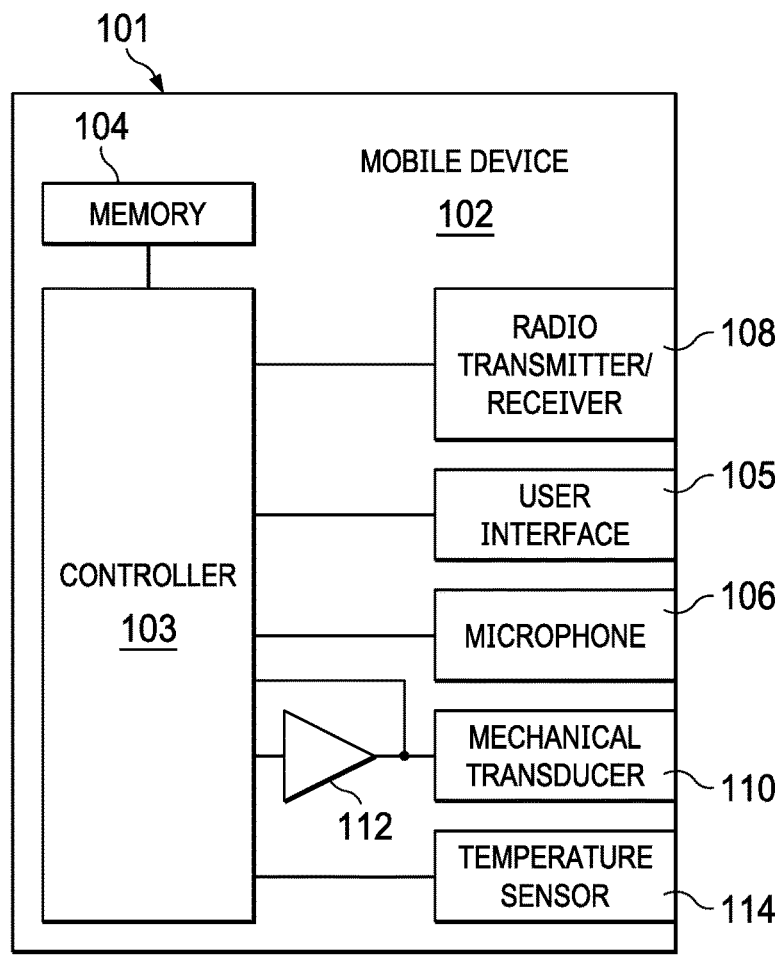
FIG. 1A illustrates a block diagram of selected components of an example mobile device, in accordance with embodiments of the present disclosure.

FIG. 1A illustrates a block diagram of selected components of an example mobile device 102, in accordance with embodiments of the present disclosure. As shown in FIG. 1A, mobile device 102 may comprise an enclosure 101, a controller 103, a memory 104, a user interface 105, a microphone 106, a radio transmitter/receiver 108, a mechanical transducer 110, an amplifier 112, and a temperature sensor 114.

Enclosure 101 may comprise any suitable housing, casing, or other enclosure for housing the various components of mobile device 102. Enclosure 101 may be constructed from plastic, metal, and/or any other suitable materials. In addition, enclosure 101 may be adapted (e.g., sized and shaped) such that mobile device 102 is readily transported on a person of a user of mobile device 102. Accordingly, mobile device 102 may include but is not limited to a smart phone, a tablet computing device, a handheld computing device, a personal digital assistant, a notebook computer, or any other device that may be readily transported on a person of a user of mobile device 102.

Controller 103 is housed within enclosure 101 and may include any system, device, or apparatus configured to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, controller 103 may interpret and/or execute program instructions and/or process data stored in memory 104 and/or other computer-readable media accessible to controller 103.

Memory 104 may be housed within enclosure 101, may be communicatively coupled to controller 103, and may include any system, device, or apparatus configured to retain program instructions and/or data for a period of time (e.g., computer-readable media). Memory 104 may include random access memory (RAM), electrically erasable programmable read-only memory (EEPROM), a Personal Computer Memory Card International Association (PCMCIA) card, flash memory, magnetic storage, opto-magnetic storage, or any suitable selection and/or array of volatile or non-volatile memory that retains data after power to mobile device 102 is turned off.

User interface 105 may be housed at least partially within enclosure 101, may be communicatively coupled to controller 103, and may comprise any instrumentality or aggregation of instrumentalities by which a user may interact with mobile device 102. For example, user interface 105 may permit a user to input data and/or instructions into mobile device 102 (e.g., via a keypad and/or touch screen), and/or otherwise manipulate mobile device 102 and its associated components. User interface 105 may also permit mobile device 102 to communicate data to a user, e.g., by way of a display device.

Microphone 106 may be housed at least partially within enclosure 101, may be communicatively coupled to controller 103, and may comprise any system, device, or apparatus configured to convert sound incident at microphone 106 to an electrical signal that may be processed by controller 103, wherein such sound is converted to an electrical signal using a diaphragm or membrane having an electrical capacitance that varies as based on sonic vibrations received at the diaphragm or membrane. Microphone 106 may include an electrostatic microphone, a condenser microphone, an electret microphone, a microelectromechanical systems (MEMS) microphone, or any other suitable capacitive microphone.

Radio transmitter/receiver 108 may be housed within enclosure 101, may be communicatively coupled to controller 103, and may include any system, device, or apparatus configured to, with the aid of an antenna, generate and transmit radio-frequency signals as well as receive radio-frequency signals and convert the information carried by such received signals into a form usable by controller 103. Radio transmitter/receiver 108 may be configured to transmit and/or receive various types of radio-frequency signals, including without limitation, cellular communications (e.g., 2G, 3G, 4G, LTE, etc.), short-range wireless communications (e.g., BLUETOOTH), commercial radio signals, television signals, satellite radio signals (e.g., GPS), Wireless Fidelity, etc.

Mechanical transducer 110 may be housed at least partially within enclosure 101 or may be external to enclosure 101, may be communicatively coupled to controller 103 (e.g., via amplifier 112), and may comprise any system, device, or apparatus made with one or more materials configured to generate electric potential or voltage when mechanical strain is applied to mechanical transducer 110, or conversely to undergo mechanical displacement or change in size or shape (e.g., change dimensions along a particular plane) when a voltage is applied to mechanical transducer 110. In some embodiments, a mechanical transducer may comprise a piezoelectric transducer made with one or more materials configured to, in accordance with the piezoelectric effect, generate electric potential or voltage when mechanical strain is applied to mechanical transducer 110, or conversely to undergo mechanical displacement or change in size or shape (e.g., change dimensions along a particular plane) when a voltage is applied to mechanical transducer 110.

Temperature sensor 114 may comprise any system, device, or apparatus (e.g., a thermometer, thermistor, etc.) configured to communicate a signal to controller 103 or another controller indicative of a temperature within mobile device 102 (e.g., proximate to amplifier 112).

Although specific example components are depicted above in FIG. 1A as being integral to mobile device 102 (e.g., controller 103, memory 104, user interface 105, microphone 106, radio transmitter/receiver 108, mechanical transducer 110, amplifier 112, and temperature sensor 114), a mobile device 102 in accordance with this disclosure may comprise one or more components not specifically enumerated above.

Figure 1B:
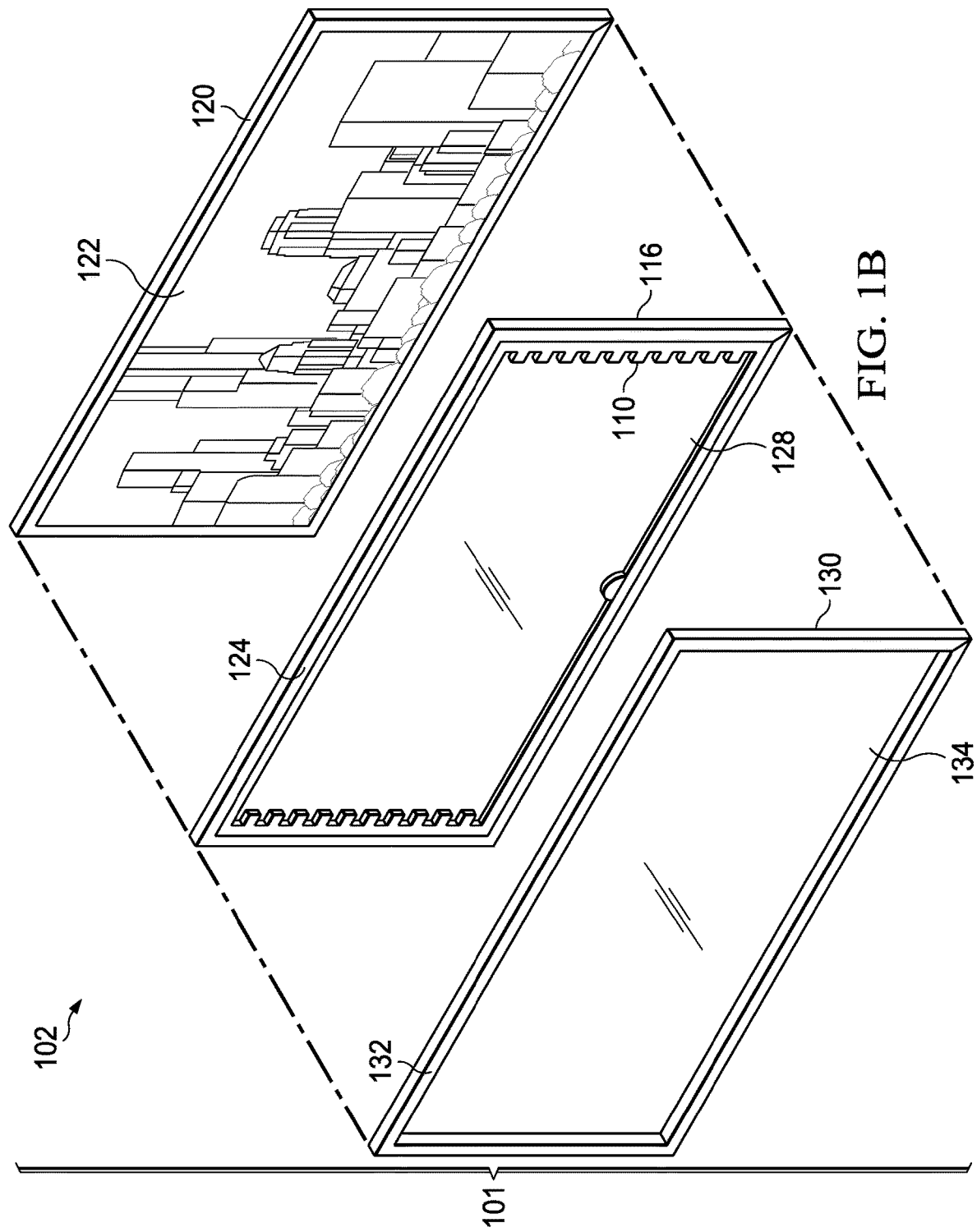
FIG. 1B illustrates an exploded perspective view of selected components of an example mobile device, in accordance with embodiments of the present disclosure.

FIG. 1B illustrates an exploded perspective view of selected components of example mobile device 102, in accordance with embodiments of the present disclosure. As shown in FIG. 1B, enclosure 101 may include a main body 120, a mechanical transducer assembly 116, and a cover assembly 130, such that when constructed, mechanical transducer assembly 116 is interfaced between main body 120 and cover assembly 130. Main body 120 may house a number of electronics, including controller 103, memory 104, radio transmitter/receiver 108, and/or microphone 106, as well as a display (e.g., a liquid crystal display) of user interface 105.

Mechanical transducer assembly 116 may comprise a frame 124 configured to hold and provide mechanical structure for one or more mechanical transducers 110 (which may be coupled to controller 103) and transparent film 128.

Cover assembly 130 may comprise a frame 132 configured to hold and provide mechanical structure for transparent cover 134. Transparent cover 134 may be made from any suitable material (e.g., ceramic) that allows visibility through transparent cover 134, protection of mechanical transducer 110 and display 122, and/or user interaction with display 122.

Although FIG. 1B illustrates mechanical transducer assembly 116 being situated between cover assembly 130 and display 122, in some embodiments, mechanical transducer assembly 116 may reside "behind" display 122, such that display 122 is situated between cover assembly 130 and mechanical transducer assembly 116. In addition, although FIG. 1B illustrates mechanical transducer 110 located at the edge of mechanical transducer assembly 116 (and thus, at or near the edge of display 122), mechanical transducer 110 may be located at any suitable location below transparent cover 134 and/or display 122. Mechanical transducers, including piezoelectric transducers, are typically used to convert electric signals into mechanical force. Thus, when used in connection with display 122 and/or transparent cover 134, one or more mechanical transducers 110 may cause vibration on a surface of transparent cover 134, which in turn may produce pressure waves in air, generating human-audible sound. Accordingly, in operation of mobile device 102, one or more mechanical transducers 110 may be driven by respective amplifiers 112 under the control of controller 103 in order to generate acoustical sound by vibrating the surface of transparent cover 134.

Figure 2:
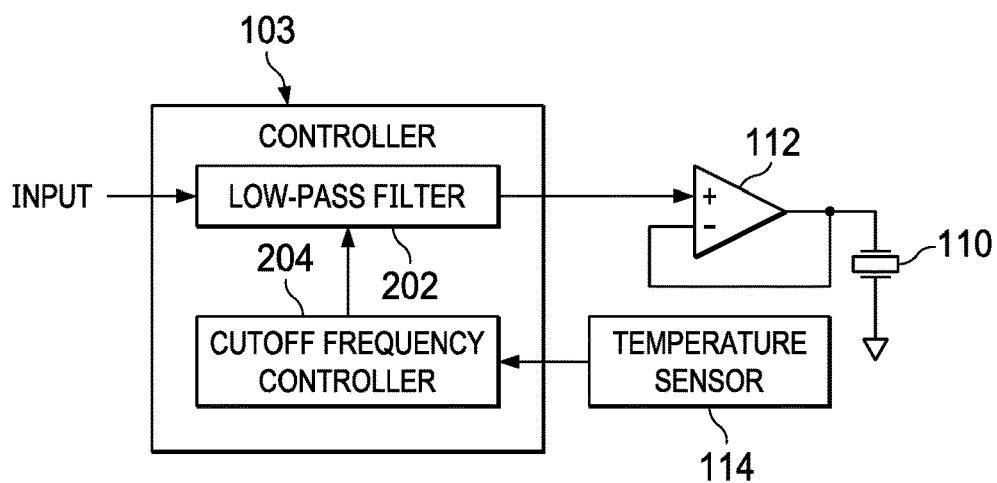
FIG. 2 illustrates selected portions of an amplifier system including detail of selected components of a controller, in accordance with embodiments of the present disclosure.

FIG. 2 illustrates selected portions of mobile device 102 including detail of selected components of controller 103, in accordance with embodiments of the present disclosure. As shown in FIG. 2, controller 103 may comprise a low-pass filter 202 and a cutoff frequency controller 204. Also as depicted in FIG. 2, mobile device 102 may include a signal path for driving mechanical transducer 110 (e.g., depicted in FIG. 2 as a piezoelectric transducer), wherein the signal path may comprise amplifier 112 and low-pass filter 202, wherein low-pass filter 202 may have a variable cutoff frequency varied by cutoff frequency controller 204, as described in greater detail below.

In operation, low-pass filter 202 may low-pass filter an input signal INPUT, effectively attenuating high-frequency content greater than the variable cutoff frequency of low-pass filter, and output a low-pass filtered version of input signal INPUT to amplifier 112. In addition, cutoff-frequency controller 204 may receive from temperature sensor 114 a temperature signal indicative of a real-time estimate of a temperature associated with amplifier 112 and vary the variable cutoff frequency of low-pass filter 202 as a function of the temperature. In some embodiments, cutoff-frequency controller 204 may vary the variable cutoff frequency inversely to the temperature (e.g., lowering the variable cutoff frequency in response to rising temperatures and vice versa).

Accordingly, low-pass filter 202 and cutoff frequency controller 204 may progressively low-pass filter a signal in response to rising temperatures. For example, initially, cutoff frequency controller 204 may set the variable cutoff frequency to a maximum frequency of interest for an application (e.g., 20 KHz for a full-bandwidth audio signal). After the temperature sensed by temperature sensor 114 increases above a particular temperature threshold, cutoff frequency controller 204 may adjust the variable cutoff frequency of low-pass filer 202 downward, thus causing reduction of output level of higher-frequency content without affecting lower-frequency content. For capacitive loads, such as piezoelectric transducers, high-frequency components such as those present in certain audio signals may demand higher current levels resulting in overheating. Therefore, attenuation of high-frequency content may protect against such higher current levels without affecting lower-frequency content. For audio applications in particular, much of the perceived overall loudness (e.g., as perceived by a human listener) may be at lower frequencies. Therefore, the systems and methods disclosed herein may greatly protect an audio amplifier from overheating without significantly affecting overall loudness of an output signal driven to a capacitive load.

Although the foregoing discussion contemplates embodiments in which mechanical transducer 110 comprises a piezoelectric transducer driven by amplifier 112, the systems and methods provided herein may be generally applied to any suitable capacitive load driven by an amplifier.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:
1. A device, comprising:
a capacitive load;
a low-pass filter configured to low-pass filter, with a variable cutoff frequency, an input signal to generate a filtered input signal;
an amplifier configured to receive the filtered input signal and amplify the filtered input signal to generate a driving signal to the capacitive load; and
a controller configured to:
receive a real-time estimate of a temperature associated with the amplifier; and vary the variable cutoff frequency as a function of the temperature.

2. The device of claim 1, wherein varying the variable cutoff frequency comprises varying the cutoff frequency inversely to the temperature.

3. The device of claim 1, wherein the capacitive load comprises a mechanical transducer.

4. The device of claim 3, wherein the mechanical transducer comprises a piezoelectric transducer.

5. The device of claim 4, further comprising a device housing comprising a surface, wherein the mechanical transducer is mechanically coupled to the surface and configured to cause vibration of the surface to generate playback of audio content in accordance with the driving signal to the mechanical transducer.

6. The device of claim 5, wherein the surface comprises a display screen of the device.

7. A method for thermally protecting an amplifier driving a capacitive load, comprising:
- low-pass filtering, with a variable cutoff frequency, an input signal to generate a filtered input signal, wherein the amplifier is configured to receive the filtered input signal and amplify the filtered input signal to generate a driving signal to the capacitive load;
- receiving a real-time estimate of a temperature associated with the amplifier; and
- varying the variable cutoff frequency as a function of the temperature.

8. The method of claim 7, wherein varying the variable cutoff frequency comprises varying the cutoff frequency inversely to the temperature.

9. The method of claim 7, wherein the capacitive load comprises a mechanical transducer.

10. The method of claim 9, wherein the mechanical transducer comprises a piezoelectric transducer.

11. The method of claim 9, wherein the mechanical transducer is mechanically coupled to a surface and configured to cause vibration of the surface to generate playback of audio content in accordance with the driving signal to the mechanical transducer.

12. The method of claim 11, wherein the surface comprises a display screen of a device.

13. A system for thermally protecting an amplifier driving a capacitive load, comprising:
- a low-pass filter configured to filter, with a variable cutoff frequency, an input signal to generate a filtered input signal, wherein the amplifier is configured to receive the filtered input signal and amplify the filtered input signal to generate a driving signal to the capacitive load; and
- a controller configured to:
    - receive a real-time estimate of a temperature associated with the amplifier; and
    - vary the variable cutoff frequency as a function of the temperature.

14. The system of claim 13, wherein varying the variable cutoff frequency comprises varying the cutoff frequency inversely to the temperature.

15. The system of claim 13, wherein the capacitive load comprises a mechanical transducer.

16. The system of claim 15, wherein the mechanical transducer comprises a piezoelectric transducer.

17. The system of claim 15, wherein the mechanical transducer is mechanically coupled to a surface and configured to cause vibration of the surface to generate playback of audio content in accordance with the driving signal to the mechanical transducer.

18. The system of claim 17, wherein the surface comprises a display screen of a device.

* * * * *